United States Patent
Kurobe et al.

(10) Patent No.: US 9,203,212 B2
(45) Date of Patent: Dec. 1, 2015

(54) SEMICONDUCTOR LASER MODULE

(71) Applicant: Furukawa Electric Co., Ltd., Tokyo (JP)

(72) Inventors: Tatsuro Kurobe, Tokyo (JP); Tatsuya Kimoto, Tokyo (JP); Hideaki Hasegawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/552,097

(22) Filed: Nov. 24, 2014

(65) Prior Publication Data

US 2015/0103853 A1    Apr. 16, 2015

Related U.S. Application Data

(63) Continuation of application No. PCT/JP2013/065251, filed on May 31, 2013.

(30) Foreign Application Priority Data

May 31, 2012    (JP) .................................. 2012-125186

(51) Int. Cl.
*H01S 3/04* (2006.01)
*H01S 5/024* (2006.01)
(Continued)

(52) U.S. Cl.
CPC ................. *H01S 5/024* (2013.01); *H01S 3/137* (2013.01); *H01S 3/1317* (2013.01); *H01S 5/02284* (2013.01); *H01S 5/02407* (2013.01); *H01S 5/0612* (2013.01); *H01S 5/0687* (2013.01); *H01S 5/06258* (2013.01);
(Continued)

(58) Field of Classification Search
CPC ............ H01S 5/02407; H01S 5/02415; H01S 5/0612; H01S 5/06837; H01S 5/0687; H01S 5/06258; H01S 5/50; H01S 3/1317; H01S 3/137
USPC ............. 372/34, 36, 32, 29.02, 50.121, 50.22
See application file for complete search history.

(56) References Cited

U.S. PATENT DOCUMENTS 6,821,798 B2    11/2004    Arakawa et al.
7,308,012 B2    12/2007    Namiwaka et al.
(Continued)

FOREIGN PATENT DOCUMENTS

JP    2003-347668 A    12/2003
JP    2004-095920 A    3/2004
(Continued)

OTHER PUBLICATIONS

U.S. Appl. No. 14/195,633, filed Mar. 17, 2010, Unkown.
(Continued)

*Primary Examiner* — Kinam Park
(74) *Attorney, Agent, or Firm* — Oblon, McClelland, Maier & Neustadt, L.L.P.

(57) ABSTRACT

A semiconductor laser module includes: a semiconductor laser element having at least one semiconductor laser; a first support member on which the semiconductor laser element is mounted; a first temperature-adjusting element adjusting a temperature of the first support member; a semiconductor optical element having a semiconductor optical amplifier amplifying a laser light outputted from the semiconductor laser element; and a second support member on which the semiconductor optical element is mounted.

12 Claims, 7 Drawing Sheets

(51) Int. Cl.
*H01S 3/137* (2006.01)
*H01S 3/131* (2006.01)
*H01S 5/06* (2006.01)
*H01S 5/0683* (2006.01)
*H01S 5/0625* (2006.01)
*H01S 5/50* (2006.01)
*H01S 5/022* (2006.01)
*H01S 5/0687* (2006.01)
*H01S 5/00* (2006.01)
*H01S 5/10* (2006.01)
*H01S 5/12* (2006.01)
*H01S 5/22* (2006.01)
*H01S 5/227* (2006.01)
*H01S 5/40* (2006.01)

(52) U.S. Cl.
CPC .......... *H01S 5/06837* (2013.01); *H01S 5/4031* (2013.01); *H01S 5/50* (2013.01); *H01S 5/0085* (2013.01); *H01S 5/02415* (2013.01); *H01S 5/1014* (2013.01); *H01S 5/12* (2013.01); *H01S 5/2206* (2013.01); *H01S 5/227* (2013.01); *H01S 5/2222* (2013.01); *H01S 5/4012* (2013.01)

(56) References Cited

U.S. PATENT DOCUMENTS

| | | |
|---|---|---|
| 7,403,347 B2 | 7/2008 | Ueki et al. |
| 7,525,726 B2 | 4/2009 | Kise et al. |
| 7,618,201 B2 | 11/2009 | Ibe et al. |
| 7,977,127 B2 | 7/2011 | Kanemoto et al. |
| 8,040,928 B2 | 10/2011 | Hasegawa |
| 8,380,032 B2 | 2/2013 | Hasegawa et al. |
| 8,457,169 B2 | 6/2013 | Kimoto et al. |
| 8,547,631 B2 | 10/2013 | Hasegawa et al. |
| 8,548,024 B2 | 10/2013 | Hasegawa et al. |
| 8,609,445 B2 | 12/2013 | Kanemoto et al. |
| 8,625,194 B2 | 1/2014 | Hasegawa |
| 8,665,919 B2 | 3/2014 | Kimoto et al. |
| 8,787,420 B2 | 7/2014 | Kimoto et al. |
| 8,837,869 B2 | 9/2014 | Akutsu et al. |
| 2003/0067948 A1* | 4/2003 | Tatsuno et al. .................. 372/32 |
| 2004/0264538 A1* | 12/2004 | Namiwaka et al. ............. 372/50 |
| 2009/0153949 A1* | 6/2009 | Kanemoto et al. ............. 359/333 |
| 2011/0305253 A1* | 12/2011 | Kobayashi et al. ............. 372/36 |
| 2014/0078580 A1 | 3/2014 | Hasegawa et al. |

FOREIGN PATENT DOCUMENTS

| | | |
|---|---|---|
| JP | 2005-019820 A | 1/2005 |
| JP | 2005-317695 A | 11/2005 |
| JP | 2006-216695 A | 8/2006 |
| JP | 4639578 B2 | 12/2010 |
| JP | 2011-258758 A | 12/2011 |
| JP | 2013-118315 A | 6/2013 |
| WO | WO 2007/032182 A1 | 3/2007 |

OTHER PUBLICATIONS

International Search Report mailed Jul. 30, 2013 for PCT/JP2013/065251 filed May 31, 2014 with English Translation.

International Written Opinion mailed Jul. 30, 2013 for PCT/JP2013/065251 filed May 31, 2014.

Office Action for Japanese application 2013-547740 mailed Jan. 21, 2014 with English Translation.

Decision of a Patent Grant for Japanese application 2013-547740 mailed Jun. 3, 2014 with English Translation.

* cited by examiner

US 9,203,212 B2

SEMICONDUCTOR LASER MODULE

CROSS-REFERENCE TO RELATED APPLICATION

This application is a continuation of PCT International Application No. PCT/JP2013/065251 filed on May 31, 2013 which claims the benefit of priority from Japanese Patent Application No. 2012-125186 filed on May 31, 2012, the entire contents of which are incorporated herein by reference.

BACKGROUND OF THE INVENTION

1. Field of the Invention

The present invention relates to a semiconductor laser module.

2. Description of the Related Art

For example, as a wavelength-tunable light source for use in dense wavelength division multiplexing (DWDM) optical communication, an integrated-type semiconductor laser element in which a plurality of semiconductor lasers having different laser oscillation wavelengths from each other are integrated is disclosed (for example, see Japanese Laid-open Patent Publication No. 2005-317695). This kind of integrated-type semiconductor laser element serves as a wavelength-tunable laser by switching a semiconductor laser for operation and changing a wavelength of laser light to be outputted. An optical coupler and a semiconductor optical amplifier (SOA) are connected to the plurality of semiconductor lasers in this order. The laser light emitted from the operated semiconductor laser and passing through the optical coupler is subject to optical amplification and outputted from an output end of the element. The integrated-type semiconductor laser element is mounted on a temperature-adjusting element for temperature adjustment of the element and enclosed in a casing to configure a semiconductor laser module. Such a semiconductor laser module is combined with an external modulator to be used as a signal light source for a long-haul optical transmission, for example, in a DWDM optical communication network system. Japan Patent No. 4639578 discloses a semiconductor laser module configured to optically amplify a laser light outputted from a distributed feedback (DFB) laser element with an SOA.

SUMMARY OF THE INVENTION

It is an object of the present invention to at least partially solve the problems in the conventional technology.

In accordance with one aspect of the present invention, a semiconductor laser module includes: a semiconductor laser element having at least one semiconductor laser; a first support member on which the semiconductor laser element is mounted; a first temperature-adjusting element adjusting a temperature of the first support member; a semiconductor optical element having a semiconductor optical amplifier amplifying a laser light outputted from the semiconductor laser element; and a second support member on which the semiconductor optical element is mounted.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
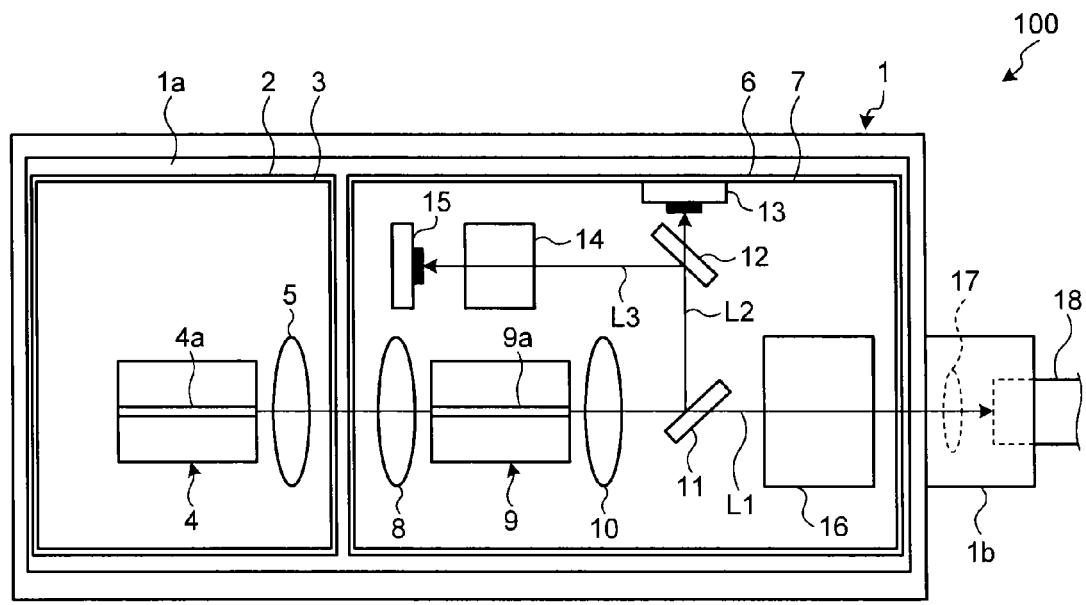
FIG. 1 is a schematic plan view of a semiconductor laser module according to an embodiment 1.

Hereafter, embodiments of a semiconductor laser module according to the present invention will be explained in detail with reference to the drawings. These embodiments do not limit the present invention. In all the drawings for embodiments below, identical or equivalent elements are given same reference numerals to omit explanations for convenience. The drawings are schematic depictions, and do not represent the actual relation between a width and a thickness of each layer and ratios of the layers. Different drawings may include portions using different scales and dimensional relations.

Power consumption increases in the DWDM optical communication network system along with its enhancement and complexity of functionality such as, for example, common use of 40 Gbps, or 100 Gbps of digital coherent communication or the like. In order to restrain an increase in power consumption, lower power consumption is also required to a semiconductor laser module used in the system as a signal light source.

In contrast, the embodiments described below achieve an effect capable of achieving a lower-power-consuming semiconductor laser module.

FIG. 1 is a schematic plan view of a semiconductor laser module according to an embodiment 1 of the present invention. As illustrated in FIG. 1, a semiconductor laser module 100 according to the present embodiment 1 has a configuration of enclosing a temperature-adjusting element 2 as a first temperature-adjusting element, a support member 3, a distributed feedback (DFB) laser element 4, a collimating lens 5, a temperature-adjusting element 6 as a second temperature-adjusting element, a support member 7, a condensing lens 8, a semiconductor optical amplification element 9 as a semiconductor optical element, a collimating lens 10, beam splitters 11 and 12, a power-monitoring photo-diode (PD) 13, an etalon filter 14, a wavelength-monitoring PD 15, an optical isolator 16, and a condensing lens 17 in a casing 1.

The casing 1 has a bottom plate 1a, a side wall portion, and an upper lid. In FIG. 1, an illustration of the upper lid is omitted for explanation of the inside. Provided at the side wall portion at a right-hand side of the drawing is a holder portion 1b which encloses the condensing lens 17. An optical fiber 18 is inserted into, and fixed to, the holder portion 1b. The casing 1 is sealed so that its inside is of an air-tight structure. The bottom plate 1a is made of copper tungsten (CuW) of which thermal conductivity is as high as 180 W/m·K to 200 W/m·K. The other portion of the casing 1 is made of Kovar (registered trademark) of which thermal expansion coefficient is low.

The temperature-adjusting element 2 is, for example, a Peltier element. The temperature-adjusting element 2 mounted on the bottom plate 1a in the casing 1 is capable of, when a driving current is supplied, cooling the DFB laser element 4 to adjust its temperature.

The support member 3 is mounted on the temperature-adjusting element 2. The DFB laser element 4 and the collimating lens 5 are mounted on the support member 3 made of aluminum nitride (AlN) of which thermal conductivity is high as 170 W/m·K. The DFB laser element 4 is mounted on the temperature-adjusting element 2 via the support member 3. The material of the support member 3 is not limited to AlN, and may be CuW, silicon carbide (SiC), diamond or the like, having a high thermal conductivity.

The DFB laser element 4 has a DFB laser portion 4a which is a stripe-shaped optical waveguide including an active layer. The DFB laser element 4 outputs a laser light L1 from the DFB laser portion 4a. A wavelength of the laser light L1 is a wavelength within a wavelength band used for optical communication (for example, 1520 nm to 1620 nm).

The collimating lens 5 is mounted on the support member 3 and disposed at a front side, from which the laser light of the DFB laser element 4 is outputted. The collimating lens 5 converts the laser light L1 outputted from the DFB laser element 4 to a collimated light.

The temperature-adjusting element 6 is mounted on the bottom plate 1a in the casing 1 and disposed at a front side of the DFB laser element 4. The temperature-adjusting element 6 is, for example, a Peltier element. The temperature-adjusting element 6 is capable of, when a driving current is supplied, adjusting temperatures of respective mounted elements thereon.

The support member 7 is mounted on the temperature-adjusting element 6. The support member 7 made of a material of which thermal conductivity is high such as AlN, CuW, SiC, diamond or the like mounts thereon the respective elements including the condensing lens 8, semiconductor optical amplification element 9, the collimating lens 10, the beam splitters 11 and 12, the power-monitoring PD 13, the etalon filter 14, the wavelength-monitoring PD 15, and the optical isolator 16. The respective elements are subjected to temperature adjustment by the temperature-adjusting element 6.

The condensing lens 8 causes the laser light L1, converted to the collimated light by the collimating lens 5, to be condensed and inputted to the semiconductor optical amplification element 9.

The semiconductor optical amplification element 9 has an SOA portion 9a which is a stripe-shaped buried mesa structure of optical waveguide including an active layer. The semiconductor optical amplification element 9 optically amplifies and outputs the laser light L1 inputted to the SOA portion 9a. The semiconductor optical amplification element 9 in this state, when an electric power is supplied from a controller not illustrated in the drawing, optically amplifies the laser light L1 to a desirable optical intensity.

A mesa width of the active layer of the SOA portion 9a, which is, for example, 1.5 μm to 3 μm similarly to that of the DFB laser portion 4a, is not limited specifically as long as the laser L1 outputted by the DFB laser element 4 can be guided in a single mode.

Figure 2:
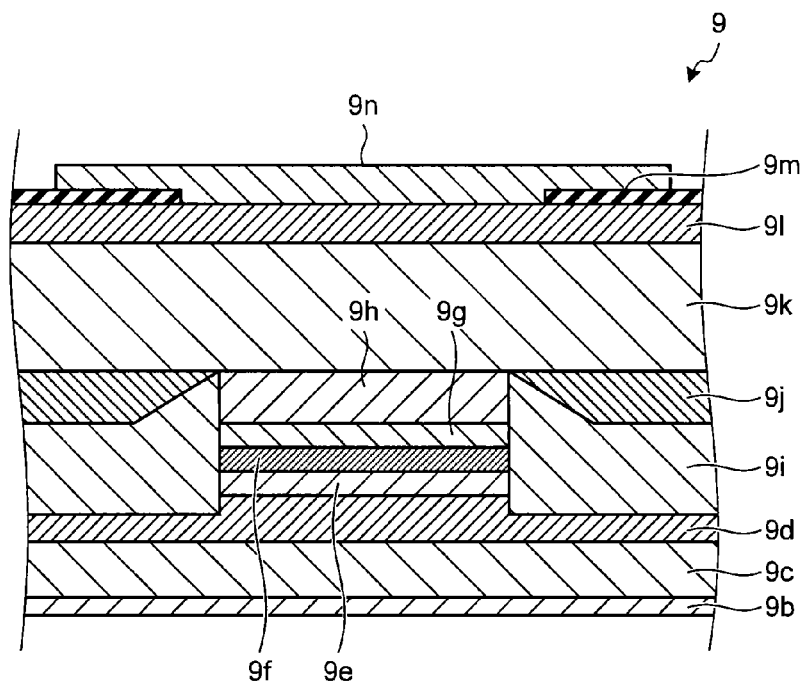
FIG. 2 is a schematic cross-sectional view of a semiconductor optical amplification element illustrated in FIG. 1.

FIG. 2 is a schematic cross-sectional view of the semiconductor optical amplification element 9. As illustrated in FIG. 2, the semiconductor optical amplification element 9 includes an n-type InP substrate 9c, an n-type InP buffer layer 9d, a lower InGaAsP-separate confinement heterostructure (SCH) layer 9e in which a composition is varied continuously, an active layer 9f which is of a multi-quantum well (MQW) structure, an upper InGaAsP-SCH layer 9g, and a p-type InP layer 9h. The n-type InP buffer layer 9d also serves as a lower cladding. An n-side electrode 9b is formed on a back surface of the n-type InP substrate 9c. The n-type InP buffer layer 9d, the lower InGaAsP-SCH layer 9e, the active layer 9f, the upper InGaAsP-SCH layer 9g, the p-type InP layer 9h are layered on the n-type InP substrate 9c in this order.

The layers from the p-type InP layer 9h to a part of the n-type InP buffer layer 9d have a stripe-shaped mesa structure. The mesa structure is buried by a p-type InP-burying layer 9i and an n-type current-blocking layer 9j. In addition, a p-type InP cladding layer 9k and an InGaAs contact layer 9l are layered in this order on the p-type InP layer 9h and the n-type current-blocking layer 9j. A surface of the InGaAs contact layer 9l is protected by an SiN protective film 9m. A part of the SiN protective film 9m opens above the InGaAs contact layer 9l. A p-side electrode 9n is formed in and/or around this opening.

The active layer 9f has a plurality of well layers and barrier layers, and each of the well layers and each of the barrier layers are layered alternately. The well layers and the barrier layers are made of, for example, a GaInNAsP-based semiconductor material or an AlGaInAs-based semiconductor material. A composition of the active layer 9f is set so that the active layer 9f has a gain peak in a wavelength which is a laser oscillation wavelength of the DFB laser element 4. The DFB laser element 4 has a cross-sectional structure similar to that of the semiconductor optical amplification element 9. However, in structure, the DFB laser element 4 is different from the semiconductor optical amplification element 9 in that a grating layer being made of InGaAsP or AlGaInAs and having a diffraction grating formed therein is disposed in the p-type InP layer 9h. The diffraction grating may be, for example, a λ/4 shift type or a normal non-phase-shift type.

The collimating lens 10 converts the laser light L1 amplified by and outputted from the semiconductor optical amplification element 9 to a collimated light.

The beam splitter 11, which is, for example, a halfmirror, causes most of the converted collimated laser light L1 to be transmitted therethrough and to be inputted into the optical isolator 16, and causes a part of the laser light L1 (laser light L2) to be reflected toward the power-monitoring PD 13. The beam splitter 12, which is, for example, a halfmirror, causes a part of the laser light L2 (laser light L3) to be reflected to the etalon filter 14.

The optical isolator 16 causes the laser light L1, which is inputted from a left-hand side of the drawing, to be transmitted to a right-hand side of the drawing, and blocks the transmission of light from the right-hand side to the left-hand side of the drawing. Hereby since a returning light is prevented from being inputted into the DFB laser element 4, the operation of the DFB laser element 4 becomes stable.

The condensing lens 17 causes the laser light L1 transmitted through the optical isolator 16 to be condensed to the optical fiber 18 and to be subjected to optical coupling. The optical fiber 18 transmits the laser light L1 to a predetermined device or the like.

Meanwhile, the power-monitoring PD 13 detects a power of the laser light L2 and outputs an electric signal corresponding to the detected power to a controller not illustrated in the drawing.

The etalon filter 14 has periodical transmission characteristics relative to wavelength (transmission wavelength characteristics) and causes the laser light L3 reflected by the beam splitter 12 to be transmitted selectively at a transmissivity corresponding to the transmission wavelength characteristics and to be inputted to the wavelength-monitoring PD 15. The wavelength-monitoring PD 15 detects a power of the laser light L3 transmitted through the etalon filter 14 and outputs an electric signal corresponding to the detected intensity to the controller not illustrated in the drawing. A period for the transmission wavelength characteristics of the etalon filter 14 may be, as a frequency of light, for example, 50 GHz, 33.3 GHz, or 25 GHz or the like.

The powers of the laser lights L2 and L3 detected by the power-monitoring PD 13 and the wavelength-monitoring PD 15 are used for a wavelength-locking control by the controller (controlling the laser light L1 to desirable wavelength and power).

To be more specific, in the wavelength-locking control, the controller controls to change a driving current and a temperature of the DFB laser element 4 so that a ratio between the power of the laser light L2 detected by the power-monitoring PD 13 and the power of the laser light L3 transmitted through the etalon filter 14 and detected by the wavelength-monitoring PD 15 becomes a ratio in a state where the power and the wavelength of the laser light L1 are desirable power and wavelength. Hereby the power and the wavelength of the laser light L1 can be controlled to desirable power and wavelength (lock wavelength). As described above, the beam splitters 11 and 12, the power-monitoring PD 13, the etalon filter 14, and the wavelength-monitoring PD 15 serve as a wavelength-monitoring mechanism monitoring a change in the wavelength of the laser light L1.

In the semiconductor laser module 100, the DFB laser element 4 is subjected to temperature control by the temperature-adjusting element 2 and the semiconductor optical amplification element 9 is subjected to temperature control by the temperature-adjusting element 6. As described above, lower power consumption is achieved in the semiconductor laser module 100 by causing the DFB laser element 4 and the semiconductor optical amplification element 9 to be subjected to temperature-control by the separate temperature-adjusting elements.

Figure 3:
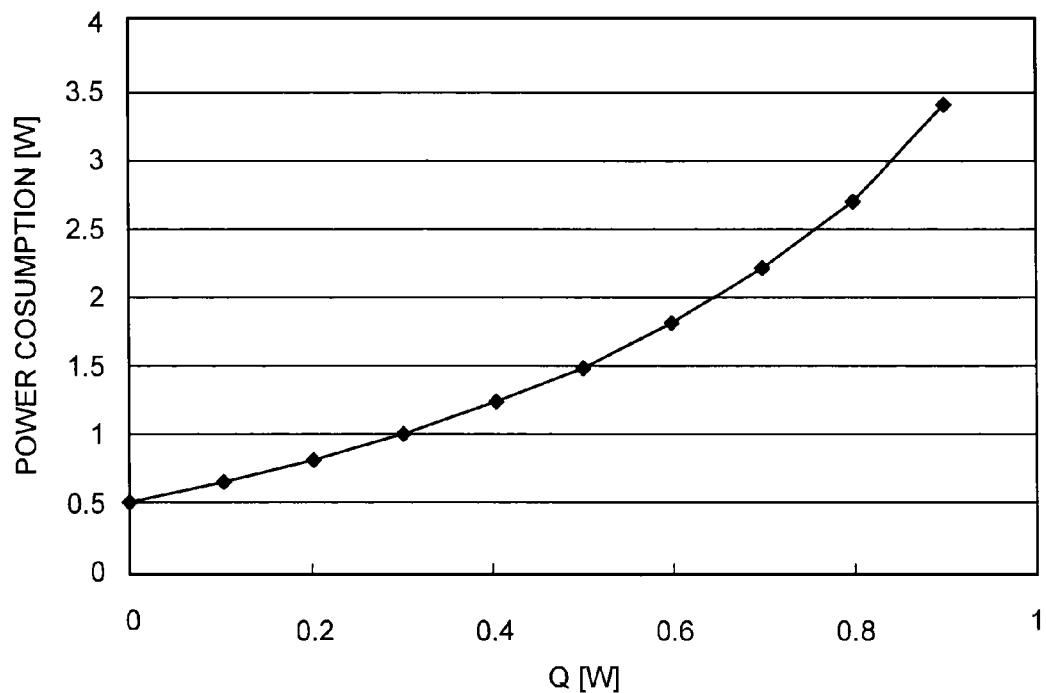
FIG. 3 is a view showing an example of a relationship between an absorbed heat amount Q and power consumption of a temperature-adjusting element.

Hereafter detail will be explained. FIG. 3 is a view illustrating an example of a relationship between a absorbed heat amount Q and a power consumption of a temperature-adjusting element (Peltier element) in a case where an environmental temperature is 75° C. As illustrated in FIG. 3, the power consumption of the temperature-adjusting element varies like a quadratic curve relative to the absorbed heat amount Q.

Therefore, if both heat generation amounts of the DFB laser element 4 and the semiconductor optical amplification element 9 are assumed to be 0.4 W, i.e. 0.8 W in total, and if temperature adjustment is attempted by cooling both of them by one temperature-adjusting element, 2.7 W of power consumption corresponding to 0.8 W of Q is necessary according to FIG. 3.

By contrast, a power consumption of the temperature-adjusting element 2 necessary for temperature-control of the DFB laser element 4 of the semiconductor laser module 100 is approximately 1.25 W corresponding to 0.4 W of Q. A power consumption of the temperature-adjusting element 6 causing the semiconductor optical amplification element 9 to be subjected to temperature-control is also approximately 1.25 W. Therefore, since the total power consumption is approximately 2.5 W, lower power consumption is possible by approximately 0.2 W than in a case of attempting temperature control with one temperature-adjusting element.

Although, as described above, the heat generation amounts of the DFB laser element 4 and the semiconductor optical amplification element 9 are assumed to be identical, i.e., 0.4 W, the heat generation amounts of the DFB laser element 4 and the semiconductor optical amplification element 9 differ actually in many cases. In the semiconductor laser module 100, lower power consumption is possible furthermore because temperature adjustment of the DFB laser element 4 and the semiconductor optical amplification element 9 each having a different heat generation amount as described above is possible with different temperature-adjusting elements 2 and 6 by adequate heat absorption amounts respectively. For example, in a case of cooling the DFB laser element 4 and the semiconductor optical amplification element 9 by one temperature-adjusting element, an attempt to decrease the temperature of the DFB laser element 4 to change the wavelength of the laser light outputted from the DFB laser element 4 simultaneously causes the semiconductor optical amplification element 9 to be cooled unnecessarily, thereby increasing the power consumption unnecessarily. However, the configuration of the present embodiment 1 is capable of preventing the semiconductor optical amplification element 9 from being cooled to such an unnecessary degree.

As described above, the semiconductor laser module 100 according to the present embodiment 1 is a lower-power-consuming semiconductor laser module.

Although, in the above-described embodiment 1, the DFB laser element 4 having the DFB laser portion 4a which is a stripe-shaped optical waveguide is used as a semiconductor laser element, the following configuration may be used as a semiconductor laser element.

Figure 4:
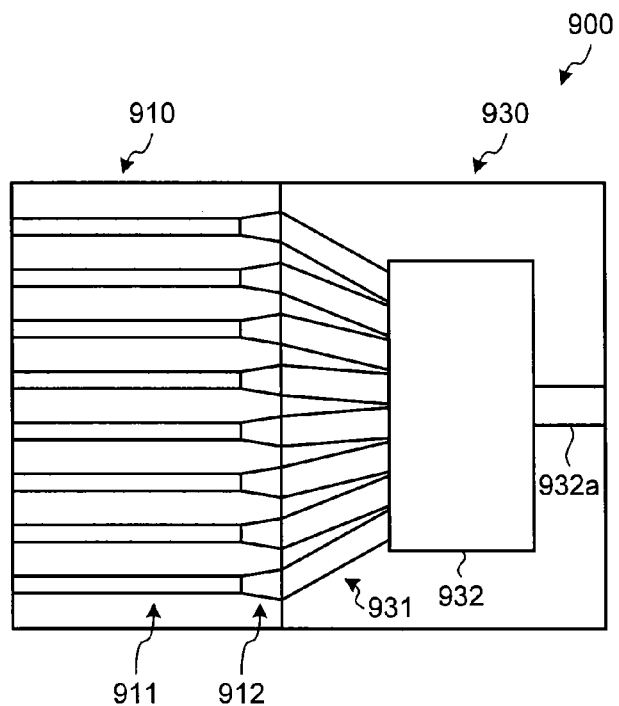
FIG. 4 is a schematic plan view of another embodiment 1 of the semiconductor laser element.

FIG. 4 is a schematic plan view of a semiconductor laser element in another embodiment 1. As illustrated in FIG. 4, a semiconductor laser element 900 includes a semiconductor laser portion 910 and an optical waveguide portion 930.

The semiconductor laser portion 910 has a plurality of semiconductor lasers 911 and a plurality of spot-size converters (SSC) 912 provided at an output side of each semiconductor laser.

Each semiconductor laser 911 is configured by a DFB laser. Each semiconductor laser 911 is an edge-emission-type laser having a stripe-shaped buried mesa structure each of which mesa width of an active layer is 1.5 μm to 3 μm, and the semiconductor lasers 911 are formed with, for example, 25 μm pitch in a width direction of the semiconductor laser portion 910. Each semiconductor laser 911 is designed so that outputted light becomes a single mode oscillation of laser light by differentiating periods of diffraction gratings provided respectively from each other and its laser oscillation wavelength is arranged with approximately 3 nm to 4 nm of interval within a desirable wavelength range. Each semiconductor laser 911 is capable of varying the laser oscillation wavelength within, for example, approximately 3 nm to 4 nm of range by adjusting temperature thereof. The number of the semiconductor lasers 911, which are, for example, 8, 12, 16 or the like, may not be limited specifically, and set appropriately in accordance with a desirable range of tunable wavelength when operating the semiconductor laser element 900 as a wavelength-tunable light source.

The plurality of SSCs 912 have buried mesa structures made of semiconductors. The plurality of SSCs 912 are of flare type in which a mesa width of a core layer at a side of an optical waveguide portion 930 is broader than a mesa width of the core layer at a side of the semiconductor laser 911. The mesa width at the side of the semiconductor laser 911 is approximately the same as the mesa width of the semiconductor laser 911, and the mesa width at the side of the optical waveguide portion 930 is, for example, 4 μm to 10 μm.

The optical waveguide portion 930 is configured by a planar lightwave circuit (PLC) made of a silica-based glass. The optical waveguide portion 930 has a plurality of bending waveguides 931 and an optical coupler 932.

Each bending waveguide 931 is connected to each SSC 912 of the semiconductor laser portion 910. Each bending waveguide 931 guides a laser light outputted from each connected semiconductor laser 911 to the optical coupler 932 in a single mode. Since the laser light outputted by the semiconductor laser 911 is converted by the SSC 912 so that its spot size conforms substantially to a spot size of the bending waveguide 931, the laser light outputted by the SSC 912 is inputted to the bending waveguide 931 with a low loss.

The optical coupler 932 is a multi-mode interferometer (MMI) type of optical coupler. The optical coupler 932 is capable of causing the output port 932a to output the laser light guided by each bending waveguide 31.

The semiconductor laser element 900 is a hybrid integration, in which the semiconductor laser portion 910 made of a semiconductor and the optical waveguide portion 930 made of a silica-based glass are joined to each other, by an adhesive such as a UV-curable resin or the like. An adhesive, e.g., an acrylic resin, an epoxy resin, or a polyester resin or the like, may be usable if it is transparent at a wavelength of the laser light from the semiconductor laser 911.

Hereafter an operation of the semiconductor laser element 900 will be explained. At first, a controller not illustrated in the drawing supplies an electric power to, and drives, selected one of the semiconductor lasers 911 capable of outputting a laser light at a wavelength which is supposed to be outputted by the semiconductor laser element 900. Along with this, the temperature of the semiconductor laser 911 is adjusted by the temperature-adjusting element 2 to which the electric power is supplied by the controller not illustrated in the drawing so that a laser oscillation wavelength of the semiconductor laser 911 to be driven becomes a desirable wavelength. Hereby the selectively driven semiconductor laser 911 outputs a desirable wavelength of laser light.

The SSC 912 connected to the selectively driven semiconductor laser 911 converts the outputted laser light to broaden its spot size, and causes the converted laser light to a predetermined one of the bending waveguides 931. The bending waveguide 931 guides the laser light to the optical coupler 932. The optical coupler 932 outputs the laser light inputted therein from the output port 932a. Herein the optical coupler 932 has an insertion loss depending on the number of the input ports connected to the bending waveguides 931, and if the number of the input ports is twelve, the insertion loss is, for example, approximately 1/12, i.e., approximately 10.8 dB.

In a case where the wavelength of the laser light to be outputted from the semiconductor laser element 900 is to be changed, the temperature of the semiconductor laser 911 to be driven is adjusted and/or the semiconductor laser 911 to be driven is switched to another. As described above, the semiconductor laser element 900 is capable of outputting a laser light of which band is continuous and wider than that in case of using a single semiconductor laser element by switching the semiconductor laser 911 to be driven and adjusting the temperature of the semiconductor laser 911.

In order to cover the entire wavelength bandwidth for use in WDM communication (for example, 1.53 μm to 1.56 μm of C-band or 1.57 μm to 1.61 μm of L-band), a wavelength can be changed at wavelength bands equal to or larger than 30 nm by providing equal to or larger than ten semiconductor lasers 911 each of which is capable of changing a laser oscillation wavelength within a range of 3 nm to 4 nm.

Figure 5:
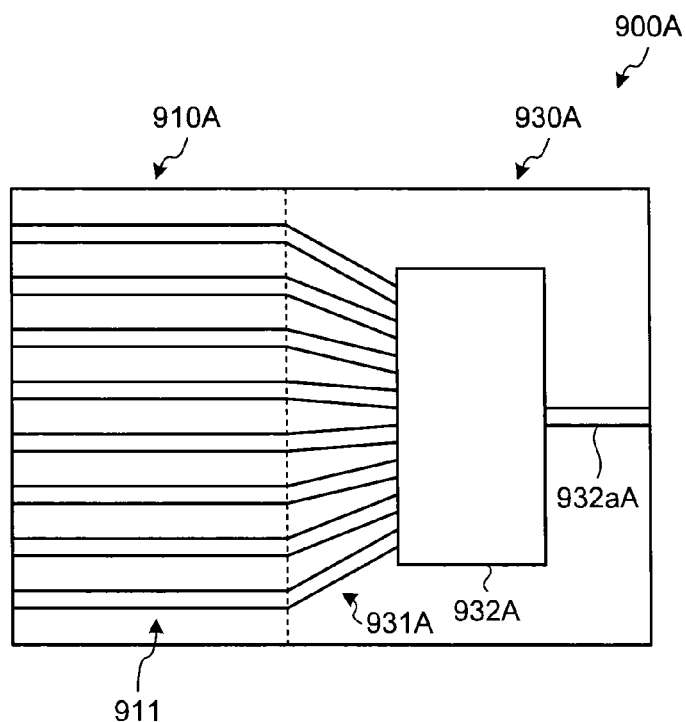
FIG. 5 is a schematic plan view of another embodiment 2 of the semiconductor laser element.

FIG. 5 is a schematic plan view of another embodiment 2 of the semiconductor laser element. As illustrated in FIG. 5, a semiconductor laser element 900A includes a semiconductor laser portion 910A and an optical waveguide portion 930A.

The semiconductor laser portion 910A has a plurality of the semiconductor lasers 911 similarly to the semiconductor laser portion 910 but differs from the semiconductor laser portion 910 in that the semiconductor laser portion 910A does not have the plurality of the SSCs 912.

The optical waveguide portion 930A is configured by a semiconductor waveguide, which is of a buried mesa structure, and is formed with the semiconductor laser portion 910A monolithically. The optical waveguide portion 930A has a plurality of bending waveguides 931A and an optical coupler 932A.

Each bending waveguide 931A is connected to each semiconductor laser 911 of the semiconductor laser portion 910A. A mesa width of a core layer of each bending waveguide 931A is approximately the same as the mesa width of each semiconductor laser 911. Each bending waveguide 931A guides a laser light outputted from each connected semiconductor laser 911 to the optical coupler 932A in a single mode.

The optical coupler 932A is an MMI-type optical coupler. The optical coupler 932A is capable of causing the output port 932aA to output the laser light guided by each bending waveguide 931A.

As described above, the semiconductor laser element 900A is an integration of the monolithically formed semiconductor laser portion 910A and the optical waveguide portion 930A.

Figure 6:
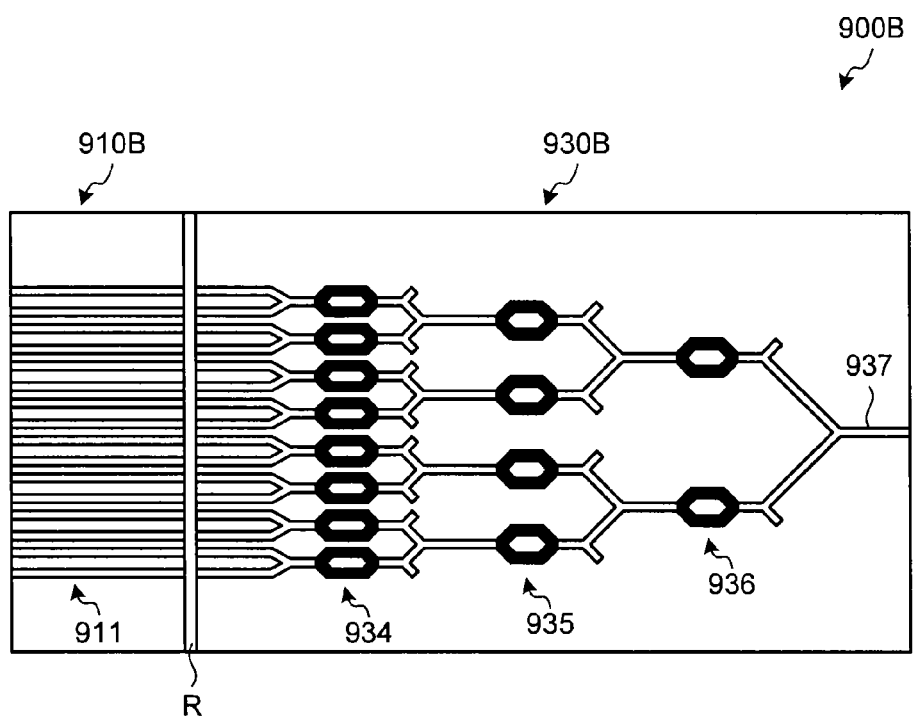
FIG. 6 is a schematic plan view of another embodiment 3 of the semiconductor laser element.

FIG. 6 is a schematic plan view of another embodiment 3 of the semiconductor laser element. As illustrated in FIG. 6, a semiconductor laser element 900B includes a semiconductor laser portion 910B and an optical waveguide portion 930B.

The semiconductor laser portion 910B has sixteen semiconductor lasers 911.

The optical waveguide portion 930B has an optical selection element outputting a predetermined wavelength of laser light selectively and causing the outputted laser light to be inputted to the semiconductor optical amplification element 9. That is, the optical waveguide portion 930B has a configuration in which eight Mach Zehnder interferometer (MZI) elements 934, four MZI elements 935, and two MZI elements 936 are connected in a multi-stage. Each MZI element 934, 935, 936 has two inputs and one output. Input sides of the eight MZI elements 934 are connected to the semiconductor lasers 911. Output sides of the eight MZI elements 934 are connected to input sides of the four MZI elements 935. Output sides of the four MZI elements 935 are connected to input sides of the two MZI elements 936. Output sides of the two MZI elements 936 are connected to input sides of a Y-branch of an output port 937. The laser light is outputted from an output side of the output port 937.

Optical input/output wavelength characteristics of the MZI elements 934 to 936 are set so that each laser light outputted from each semiconductor laser 911 connected to each input side of the MZI element 934 is guided to the MZI elements 934, the MZI elements 935, and the MZI elements 936 in this order with a low loss to be outputted from the output port 937.

The optical waveguide portion 930B may be configured by a PLC made of a silica-based glass or by a semiconductor waveguide.

The semiconductor laser element 900B is an integration in which the semiconductor laser portion 910B and the optical waveguide portion 930B are joined to each other by an adhesive R such as UV-curable resin or the like. The adhesive R may be usable if it is transparent at a wavelength of the laser light from the semiconductor lasers 911.

Figure 7:
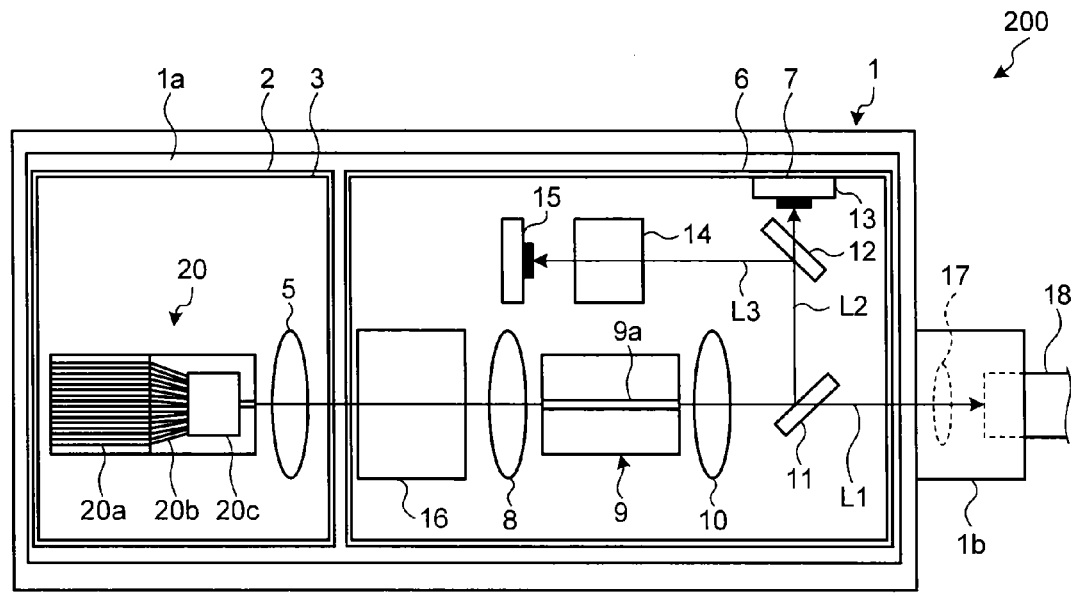
FIG. 7 is a schematic plan view of the semiconductor laser module according to an embodiment 2.

FIG. 7 is a schematic plan view of a semiconductor laser module according to an embodiment 2 of the present invention. As illustrated in FIG. 3, the semiconductor laser module 200 according to the present embodiment 2 has a configuration in which the DFB laser element 4 is replaced with an integrated-type semiconductor laser element 20 and the optical isolator 16 is disposed between the integrated-type semiconductor laser element 20 and the semiconductor optical amplification element 9 in the semiconductor laser module 100 illustrated in FIG. 1.

The integrated-type semiconductor laser element 20 has a configuration similar to that of the semiconductor laser element 900 as illustrated in FIG. 4. That is, the integrated-type semiconductor laser element 20 includes a plurality of DFB laser stripes 20a, a plurality of optical waveguides 20b guiding laser lights outputted from the plurality of DFB laser stripes 20a, and an optical coupler 20c capable of coupling the laser lights guided by the plurality of optical waveguides 20b. The optical coupler 20c is, for example, an MMI-type optical coupler.

The plurality of DFB laser stripes 20a output laser lights of which wavelengths differ to each other within a range of, for example, 1520 nm to 1620 nm. The integrated-type semiconductor laser element 20 is capable of changing the wavelength of the laser light L1 to be outputted by switching one of the DFB laser stripes 20a to another and changing the temperature of the integrated-type semiconductor laser element 20, and thus serves as a wavelength-tunable laser.

Herein in the semiconductor laser module 200, the optical isolator 16 is disposed between the integrated-type semiconductor laser element 20 and the semiconductor optical amplification element 9. Hereby an effect is obtained that, since amplified spontaneous emission (ASE) light produced in the semiconductor optical amplification element 9 is prevented from being inputted to the integrated-type semiconductor laser element 20, linewidths (spectrum linewidths) of the laser light outputted from the integrated-type semiconductor laser element 20 and the laser light L1 finally outputted from the integrated-type semiconductor laser element 20 are prevented from being broadened.

It is preferable that the optical isolator 16 is mounted not at the side of the support member 3 but at the side of the support member 7. A change in temperature of the support member 3 on which the integrated-type semiconductor laser element 20 is mounted is greater than that of the support member 7 on which the semiconductor optical amplification element 9 is mounted. Therefore, stable characteristics can be obtained by mounting the optical isolator 16 at the side of the support member 7.

Figure 8:
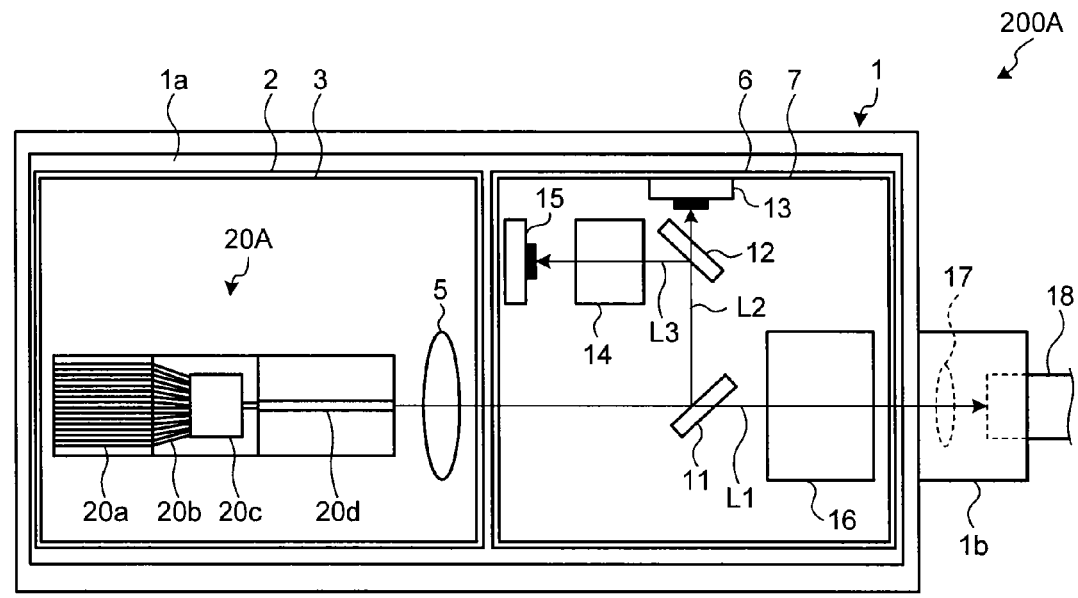
FIG. 8 is a schematic plan view of a semiconductor laser module according to a comparative embodiment.

In order to explain the above-described effect, for example, the semiconductor laser module 200 is compared with a semiconductor laser module 200A according to a comparative embodiment form as illustrated in FIG. 8. The semiconductor laser module 200A has a configuration in which the integrated-type semiconductor laser element 20 is replaced with an integrated-type semiconductor laser element 20A and the semiconductor optical amplification element 9 is deleted in the semiconductor laser module 200. The integrated-type semiconductor laser element 20A is an element in which a plurality of DFB laser stripes 20a, a plurality of optical waveguides 20b, an optical coupler 20c, and an SOA portion 20d having a configuration similar to that of the SOA portion 9a of the semiconductor optical amplification element 9 are integrated.

Figure 9:
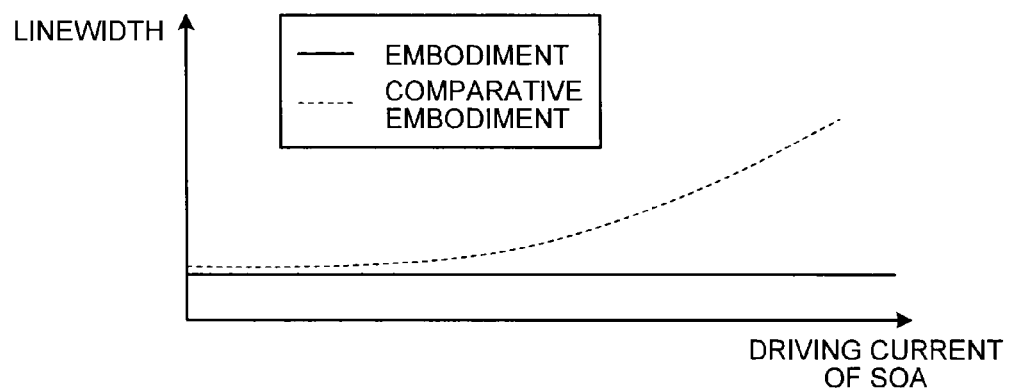
FIG. 9 is a view showing a relationship between a driving current of SOA and a linewidth of a laser light.

FIG. 9 is a view illustrating a relationship between a driving current of the SOA portion and a linewidth of the laser light to be outputted in a case where the semiconductor laser module 200 according to the embodiment 2 and the semiconductor laser module 200A according to the comparative embodiment are driven under the same driving conditions.

As illustrated in FIG. 9, in the case of the comparative embodiment, the linewidth of the laser light to be outputted increases along with an increase in the driving current of the SOA portion 20d. This is because a power of an ASE light inputted from the SOA portion 20d to the DFB laser stripe 20a increases along with an increase in the driving current of the SOA portion 20d.

By contrast, in the case of the embodiment 2, the linewidth of the outputted laser light is constant even if the driving current for the SOA portion 9a increases. This is because the optical isolator 16 prevents the ASE light from being inputted from the SOA portion 9a to the DFB laser stripe 20a.

The above-described semiconductor laser module 200 preventing the broadening of the linewidth of the laser light is appropriate for a signal light source for use in 40 Gbps, or 100 Gbps of large capacity digital coherent communication by making the linewidth of the laser light L1, for example, equal to or lower than 100 kHz.

Figure 10:
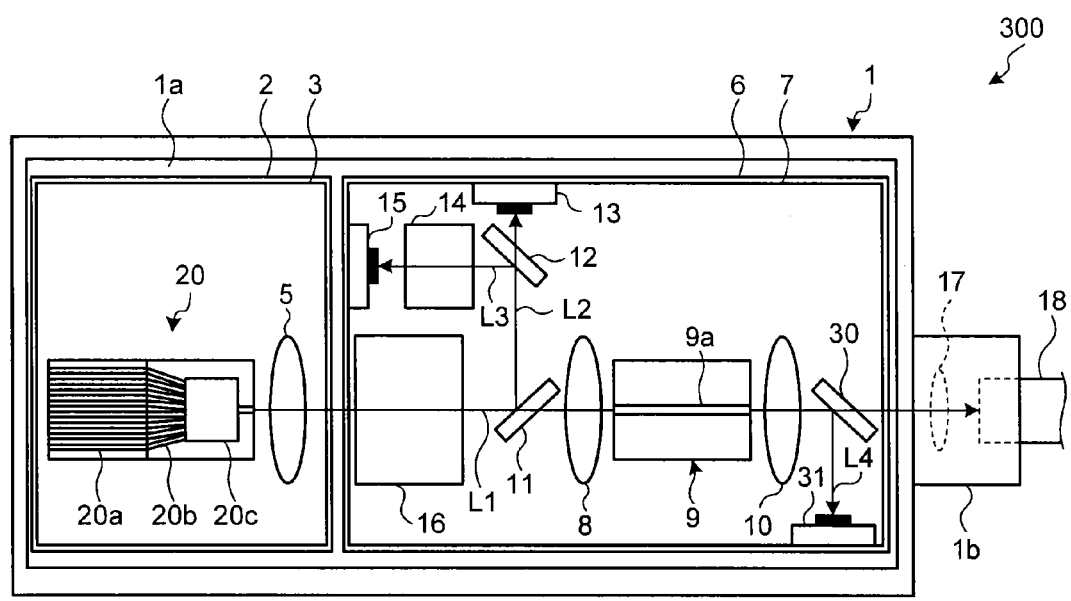
FIG. 10 is a schematic plan view of a semiconductor laser module according to an embodiment 3.

FIG. 10 is a schematic plan view of a semiconductor laser module according to an embodiment 3 of the present invention. As illustrated in FIG. 10, a semiconductor laser module 300 according to the present embodiment 3 has a configuration disposing the beam splitter 11 between the optical isolator 16 and the condensing lens 8 and further including a beam splitter 30 and a power-monitoring PD 31 in the semiconductor laser module 200 illustrated in FIG. 7.

In the semiconductor laser module 300, it is conducted that, in the wavelength-locking control, a control of making the wavelength of the laser light L1 to a desirable wavelength by using the laser light L1 outputted from the integrated-type semiconductor laser element 20 and prior to be inputted to the semiconductor optical amplification element 9. The beam splitter 30 reflects a part of the laser light L1 (laser light L4) subjected to optical amplification by the semiconductor optical amplification element 9. The power-monitoring PD 31 detects a power of the laser light L4 to output an electric signal according to the detected power to a controller not illustrated in the drawing. The power of the laser light L4 detected by the power-monitoring PD 31 is used by the controller to control the power of the laser light L1 to a desirable power. Such a configuration is capable of wavelength-locking control prior to outputting the laser light L1 from the semiconductor laser module 300. The laser light L1 at a stable wavelength over a wide range of power can be outputted from the semiconductor laser module 300 by adjusting the semiconductor optical amplification element 9.

Figure 11:
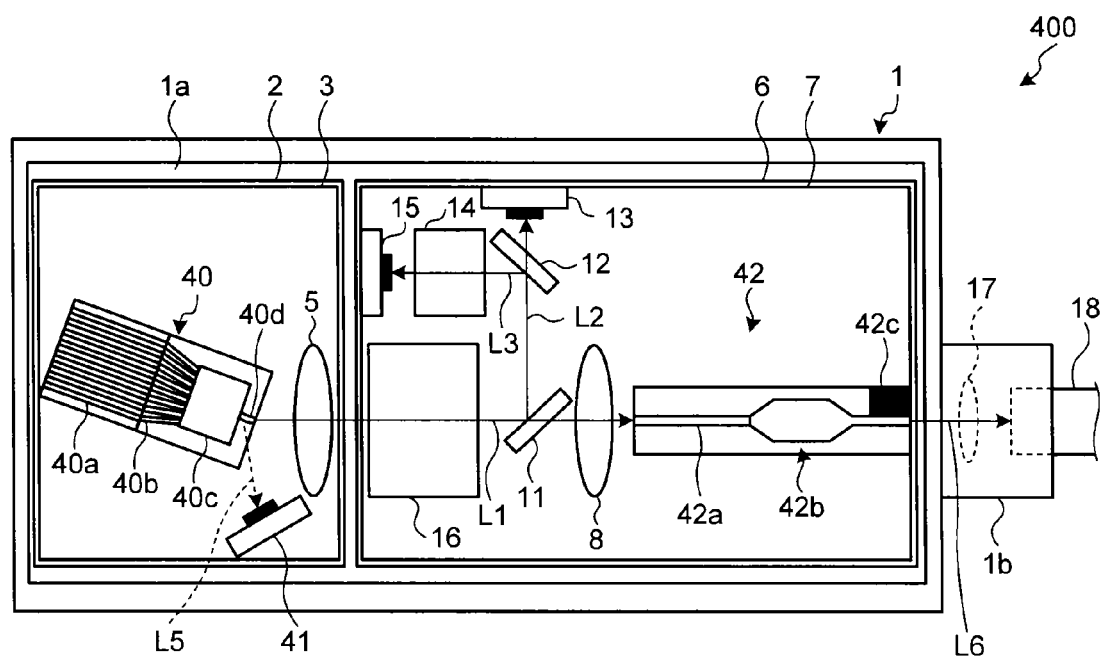
FIG. 11 is a schematic plan view of a semiconductor laser module according to an embodiment 4.

FIG. 11 is a schematic plan view of a semiconductor laser module according to an embodiment 4 of the present invention. As illustrated in FIG. 11, a semiconductor laser module 400 according to the present embodiment 4 has a configuration in which, in the semiconductor laser module 300 illustrated in FIG. 10, the integrated-type semiconductor laser element 20 is replaced with an integrated-type semiconductor laser element 40, a power-monitoring PD 41 is provided in the vicinity of the integrated-type semiconductor laser element 40, and the beam splitter 30 and the power-monitoring PD 31 are replaced with an optical integration element 42 which is an semiconductor optical element in which an optical amplifier, an optical modulator, and a PD or the like are integrated.

The integrated-type semiconductor laser element 40 includes a plurality of DFB laser stripes 40a, a plurality of optical waveguides 40b guiding laser lights outputted by the plurality of DFB laser stripes 40a, an optical coupler 40c capable of coupling the laser lights guided by the plurality of the optical waveguides 40b, and an optical bending waveguide 40d guiding the laser light outputted by the optical coupler 40c. The optical bending waveguide 40d bends at an end surface of an output side of the integrated-type semiconductor laser element 40 to form an angle of approximately 7° to 8° with respect to a direction that is perpendicular to the end surface. Hereby a reflected light of the laser light L1 outputted from the output-side's end surface of the integrated-type semiconductor laser element 40 can be prevented from returning to the side of the DFB laser stripe 40a.

A part of the laser light L1 leaks from a bending portion of the optical bending waveguide 40d. The power-monitoring PD 41 detects a power of the leaking light L5 to output an electric signal corresponding to the detected power to a controller not illustrated in the drawing. The power of the leaking light L5 can be used by the controller to control the laser light L1 to a desirable power.

The optical integration element 42 includes an SOA portion 42a, an MZI-type optical modulator portion 42b, and a power-monitoring PD 42c.

In the optical integration element 42, the SOA portion 42a amplifies the laser light L1 condensed by and inputted from the condensing lens 8. The MZI-type optical modulator portion 42b superposes a desirable modulation signal over the most of the amplified laser light, and after that, outputs it as a laser light L6 from an output port at one side to a side of the condensing lens 17 and outputs a part of the modulated laser light to an output port at the other side. The power-monitoring PD 42c is provided at the other side of the output port. The power-monitoring PD 42c detects a power of the part of the modulated laser light to output an electric signal corresponding to the detected power to the controller not illustrated in the drawing. The detected power can be used by the controller controlling the laser light L6 to a desirable power.

Figure 12:
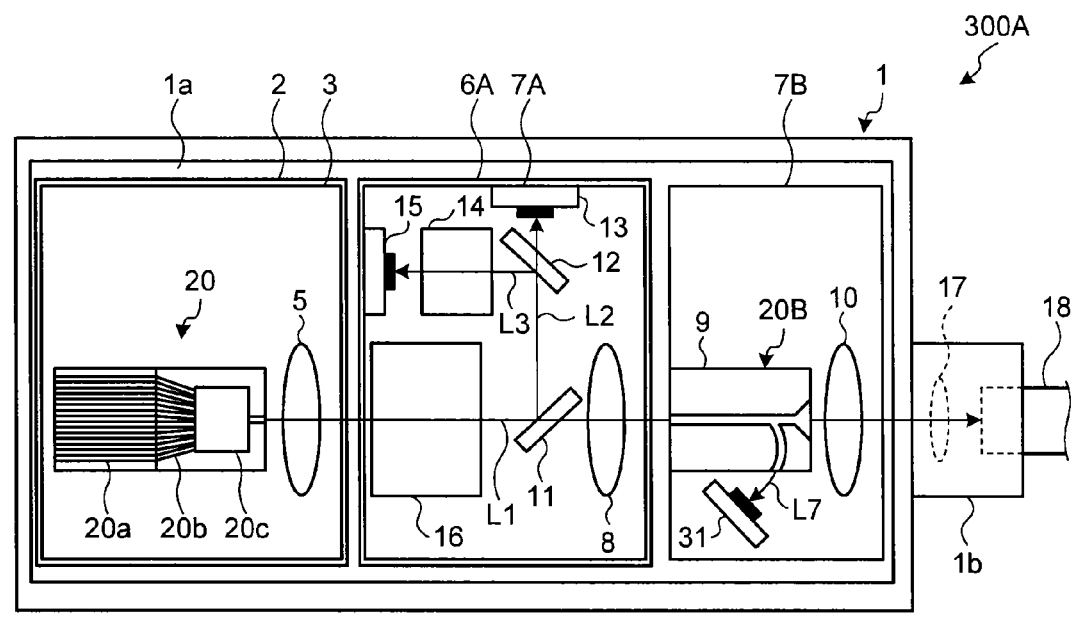
FIG. 12 is a schematic plan view of a semiconductor laser module according to an embodiment 5.

FIG. 12 is a schematic plan view of a semiconductor laser module according to an embodiment 5 of the present invention. As illustrated in FIG. 12, a semiconductor laser module 300A according to the present embodiment 5 has a configuration in which, in the semiconductor laser module 300 illustrated in FIG. 10, the temperature-adjusting element 6 is replaced with a temperature-adjusting element 6A, the support member 7 is replaced with support members 7A and 7B, the semiconductor optical amplification element 9 is replaced with a semiconductor optical amplification element 20B, the beam splitter 30 is deleted, and a disposition of the power-monitoring PD 31 is changed.

The temperature-adjusting element 6A is, for example, a Peltier element. The temperature-adjusting element 6A is, when a driving current is supplied, capable of adjusting a temperature of each element mounted thereon. The support member 7A is mounted on the temperature-adjusting element 6A. The support member 7A is made of a material, of which thermal conductivity is high, such as AlN, CuW, SIC, diamond, or the like. Each element such as the condensing lens 8, the beam splitters 11 and 12, the power-monitoring PD 13, the etalon filter 14, the wavelength-monitoring PD 15, and the optical isolator 16 is mounted on the support member 7A.

Each element is subjected to temperature adjustment by the temperature-adjusting element 6A.

The support member 7B is mounted on the bottom plate 1a of the casing 1. The support member 7B is made of a material of which thermal conductivity is high, such as AlN, CuW, SiC, diamond, or the like. Each element such as the semiconductor optical amplification element 20B, the collimating lens 10, and the power-monitoring PD 31 is mounted on the support member 7B.

Figure 13:
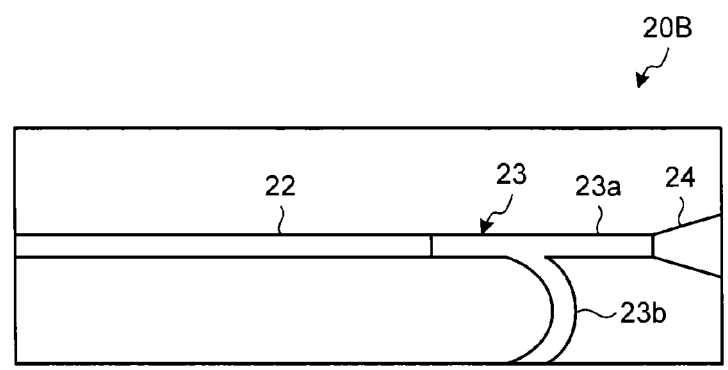
FIG. 13 is a schematic plan view of a semiconductor optical amplification element illustrated in FIG. 12.

FIG. 13 is a schematic plan view of a semiconductor optical amplification element illustrated in FIG. 12. As illustrated in FIG. 13, the semiconductor optical amplification element 20B has an SOA portion 22, a branch waveguide 23, and an SSC 24, that are of a buried mesa structure made of a semiconductor.

The branch waveguide 23 is inserted between the SOA portion 22 and the SSC 24 and has a linear portion 23a and a U-shaped branch portion 23b. The SSC 24 is a flare type SSC of which mesa width of a core layer at a side of the branch waveguide 23 is broader than a mesa width of the core layer at an output side facing the optical fiber 18 and is set at a mesa width capable of optical coupling with the optical fiber 18 via a lens system with low loss.

In the semiconductor optical amplification element 20B, when the laser light L1 transmitted through the condensing lens 8 is inputted, the SOA portion 22 amplifies the inputted laser light L1 to output to the branch waveguide 23. The branch waveguide 23 outputs most of the amplified laser light from an output side of the linear portion 23a to the SSC 24 and outputs the rest of the amplified laser light from an output side of the branch portion 23b. The laser light outputted from the SSC 24 is coupled to the optical fiber 18 in low loss, and is outputted to outside the semiconductor laser module 300A through the optical fiber 18.

The rest of the laser light L7 outputted from the output side of the branch portion 23b is inputted to the power-monitoring PD 31. The power-monitoring PD 31 detects a power of the laser light L7 and outputs an electric signal corresponding to the detected power to a controller not illustrated in the drawing. The power of the laser light L7 detected by the power-monitoring PD 31 is used by the controller controlling the laser light L1 to a desirable power.

The semiconductor laser module 300A according to the present embodiment 5 having the above-described configuration achieves still lower power consumption than a conventional module.

That is, in a conventional semiconductor laser element of this type is mounted on a temperature-adjusting element in which a semiconductor laser portion, an optical waveguide portion, and a semiconductor optical amplification portion were integrated monolithically. Therefore, because it is of a structure cooling the semiconductor optical amplification portion simultaneously in a case where a temperature adjustment is conducted by the temperature-adjusting element for adjusting a laser oscillation wavelength of the semiconductor laser, an electric power was consumed to an excessive degree for cooling the semiconductor optical amplification portion.

By contrast, in the semiconductor laser module 300A, temperature adjustment of the integrated-type semiconductor laser element 20 is conducted by the temperature-adjusting element 2 to adjust a laser oscillation wavelength of the DFB laser stripe, the semiconductor optical amplification element 20B is operated without cooling. Hereby since an electric power is not consumed for cooling the SOA portion 22, still lower power consumption is achieved than the conventional module. A temperature of the SOA portion 22 in this state is approximately the same as a temperature of a module of the semiconductor laser module 300A, i.e., an environmental temperature of the semiconductor laser module 300A, and varies along with a change in a temperature of the module.

In a case of this kind of an integrated type of semiconductor laser element including a plurality of semiconductor lasers, an optical waveguide portion for guiding laser lights from the plurality of the semiconductor lasers to one semiconductor optical amplification element is necessary. Since the optical waveguide portion has an insertion loss to some degree, optical amplification by the semiconductor optical amplification element is necessary for compensating for the insertion loss at the optical waveguide portion. Therefore, power consumption increases furthermore, and along with this, power consumption increases for cooling the semiconductor optical amplification element. However, since the device of the present embodiment 5 operates without cooling the semiconductor optical amplification element 20B, an effect of reducing power consumption in a configuration requiring such an optical waveguide portion becomes remarkable.

As described above, if the material of the active layer of the SOA portion 22 is a semiconductor material including Al such as a GaInNAsP-based semiconductor material or an AlGaInAs-based semiconductor material or the like, dependency, of its optical amplification characteristics, on temperature is small, i.e., within a range of operating temperatures of the semiconductor laser module 300A (for example 25° C. to 75° C.). Therefore, it is preferable from a viewpoint of operating without cooling the SOA portion 22. However, the material of the active layer is not limited to the above-described materials. Even if it is a material of which dependency, of optical amplification characteristics, on temperature is high, stable amplification characteristics not depending on the temperature can be obtained by controlling a driving condition of the SOA portion 22 in accordance with the temperature characteristics or the like of the constituent material.

As described above, the semiconductor laser module 300A according to the present embodiment 5 is of a still lower power consumption than a conventional semiconductor laser module.

In the present embodiment 5, the optical fiber 18 can be replaced with a lensed fiber in which a lens shape suitable for an optical connection is formed at an end portion of an optical fiber. In a case of using the lensed fiber, the collimating lens 10 and the condensing lens 17 may not be provided.

Herein a relationship between a driving current of the SOA portion and a spectrum linewidth of an outputted laser light was studied by using the semiconductor laser module 200 according to the embodiment 2 having the structure illustrated in FIG. 7 and the semiconductor laser module 200A according to the comparative embodiment illustrated in FIG. 8. For the driving conditions, a driving current $I_{dfb}$ of the DFB laser stripe was 400 mA, a temperature of the semiconductor laser element was set at 30° C., and the driving current of the SOA portion was changed from 50 mA to 400 mA.

Figure 14:
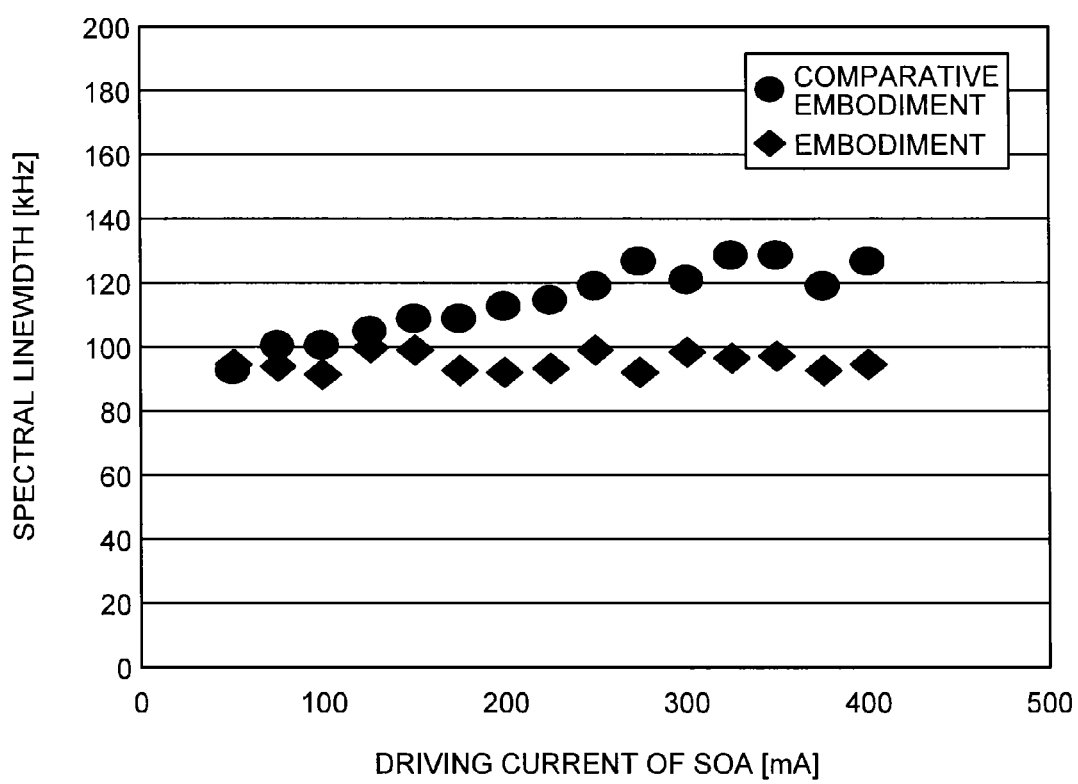
FIG. 14 is a view showing a relationship between a driving current of an SOA portion and a linewidth of an outputted laser light.

FIG. 14 is a view illustrating a relationship between the driving current of the SOA portion and a linewidth of the outputted laser light. As illustrated in FIG. 14, although the spectrum linewidth of the outputted laser light increased along with an increase in the driving current of the SOA portion in a case of the comparative embodiment, by contrast, the spectrum linewidth of the outputted laser light is almost constant even in a case of the embodiment 2 if the driving current of the SOA portion was increased, thus, the linewidth of the outputted laser light can be made equal to or lower than 100 kHz.

The above-described embodiments do not limit the present invention. The present invention includes a configuration combining the above-described elements appropriately. For example, in the semiconductor laser module 100 illustrated in FIG. 1, the optical isolator 16 may be disposed between the DFB laser element 4 and the semiconductor optical amplification element 9. Further effects or modification examples can be derived by an ordinary skilled person in the art easily. Therefore, further wide aspects of the present invention are not limited to the specific, detailed, and representative embodiment explained and described above.

As described above, the semiconductor laser module according to the present invention is preferable for use mainly in an optical communication.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor laser module comprising:
    a semiconductor laser element having at least one semiconductor laser;
    a first support member on which the semiconductor laser element is mounted;
    a first temperature-adjusting element configured to adjust a temperature of the first support member;
    a semiconductor optical element having a semiconductor optical amplifier configured to amplify a laser light outputted from the semiconductor laser element;
    a second support member on which the semiconductor optical element is mounted;
    a second temperature-adjusting element configured to adjust a temperature of the second support member; and
    an optical isolator disposed between the semiconductor laser element and the semiconductor optical element and mounted on the second support member, wherein
    the semiconductor laser element comprises a plurality of the semiconductor lasers configured to output laser lights of which wavelengths are different from each other within a predetermined wavelength range and an optical coupler configured to couple the laser lights outputted from the plurality of the semiconductor lasers, and
    a wavelength of the laser light outputted from the semiconductor laser element is changed by switch of the semiconductor laser to be operated from among the plurality of semiconductor lasers and change of a temperature of the semiconductor laser element by the first temperature-adjusting element.

2. The semiconductor laser module according to claim 1, further comprising:
    a wavelength-monitoring mechanism configured to monitor a change in the wavelength of the laser light outputted from the semiconductor laser element before being inputted to the semiconductor optical amplifier; and
    a power-monitoring unit configured to monitor a power of the laser light amplified by the semiconductor optical amplifier.

3. The semiconductor laser module according to claim 1, wherein the optical isolator prevents an ASE light produced at the semiconductor optical amplifier from being inputted to the semiconductor laser element.

4. The semiconductor laser module according to claim 1, wherein the predetermined wavelength range is within 1520 nm and 1620 nm.

5. The semiconductor laser module according to claim 1, wherein when a driving current of the semiconductor optical amplifier is changed within a range from equal to or greater than 50 mA to equal to or less than 400 mA, a spectrum linewidth of the laser light is constant.

6. The semiconductor laser module according to claim 1, wherein when a driving current of the semiconductor optical amplifier is changed within a range from equal to or greater than 50 mA to equal to or less than 400 mA, a spectrum linewidth of the laser light is equal to or less than 100 kHz.

7. A semiconductor laser module comprising:
a semiconductor laser element having at least one semiconductor laser;
a first support member on which the semiconductor laser element is mounted;
a first temperature-adjusting element configured to adjust a temperature of the first support member;
a semiconductor optical element having a semiconductor optical amplifier configured to amplify a laser light outputted from the semiconductor laser element;
a second support member on which the semiconductor optical element is mounted;
an optical isolator disposed between the semiconductor laser element and the semiconductor optical element; and
a third support member on which the optical isolator is mounted, wherein
the semiconductor laser element comprises a plurality of the semiconductor lasers configured to output laser lights of which wavelengths are different from each other within a predetermined wavelength range and an optical coupler configured to couple the laser lights outputted from the plurality of the semiconductor lasers,
a wavelength of the laser light outputted from the semiconductor laser element is changed by switch of the semiconductor laser to be operated from among the plurality of the semiconductor lasers and change of a temperature of the semiconductor laser element by the first temperature-adjusting element, and
the temperature of the second support member is not adjusted.

8. The semiconductor laser module according to claim 7, wherein the optical isolator prevents an ASE light produced at the semiconductor optical amplifier from being inputted to the semiconductor laser element.

9. The semiconductor laser module according to claim 7, wherein the predetermined wavelength range is within 1520 nm to 1620 nm.

10. The semiconductor laser module according to claim 7, wherein when a driving current of the semiconductor optical amplifier is changed within a range from equal to or greater than 50 mA to equal to or less than 400 mA, a spectrum linewidth of the laser light is constant.

11. The semiconductor laser module according to claim 7, wherein when a driving current of the semiconductor optical amplifier is changed within a range from equal to or greater than 50 mA to equal to or less than 400 mA, a spectrum linewidth of the laser light is equal to or less than 100 kHz.

12. The semiconductor laser module according to claim 7, further comprising:
a wavelength-monitoring mechanism configured to monitor a change in the wavelength of the laser light outputted from the semiconductor laser element before being input into the semiconductor optical amplifier; and
a power-monitoring unit configured to monitor a power of the laser light amplified by the semiconductor optical amplifier.

* * * * *